(12) United States Patent
Zosel

(10) Patent No.: US 7,692,390 B2
(45) Date of Patent: Apr. 6, 2010

(54) ELECTRON BEAM SYSTEMS

(75) Inventor: Karsten Zosel, Fürstenfeldbruck (DE)

(73) Assignee: All Welding Technologies AG (DE)

( * ) Notice: Subject to any disclaimer, the term of this patent is extended or adjusted under 35 U.S.C. 154(b) by 26 days.

(21) Appl. No.: 11/829,412

(22) Filed: Jul. 27, 2007

(65) Prior Publication Data

US 2008/0143278 A1    Jun. 19, 2008

(30) Foreign Application Priority Data

Jul. 28, 2006    (DE) .................. 10 2006 035 793

(51) Int. Cl.
  *H05B 39/04*    (2006.01)
(52) U.S. Cl. .................. 315/226; 315/291; 315/209 R
(58) Field of Classification Search .................. 315/291, 315/209 R, 289, 361, 362; 330/200
  See application file for complete search history.

(56) References Cited

U.S. PATENT DOCUMENTS

| | | | |
|---|---|---|---|
| 2,989,614 A | 6/1961 | Steigerwald | |
| 3,390,222 A | 6/1968 | Anderson | |
| 3,431,457 A | 3/1969 | Hinkein et al. | |
| 3,835,403 A | 9/1974 | Leinemann | |
| 4,041,311 A | 8/1977 | Martin | |
| 4,075,485 A * | 2/1978 | Lijewski et al. | ............ 250/369 |
| 4,891,523 A | 1/1990 | Schmitt | |
| 6,097,163 A | 8/2000 | Chauvin et al. | |
| 6,214,408 B1 | 4/2001 | Bahr et al. | |
| 6,436,466 B2 | 8/2002 | Bahr et al. | |
| 6,861,906 B2 * | 3/2005 | Mori et al. | ................. 330/295 |
| 2004/0079883 A1 | 4/2004 | Sugiura et al. | |

FOREIGN PATENT DOCUMENTS

| | | |
|---|---|---|
| DE | 197 29 083 C1 | 8/1998 |
| JP | 02-247964 | 10/1990 |

OTHER PUBLICATIONS

European Search Report dated May 14, 2009 for Application No. 07014317.7-2215/1885059.
Written Opinion for Application No. 07 014 317.7.

* cited by examiner

*Primary Examiner*—Douglas W Owens
*Assistant Examiner*—Jianzi Chen
(74) *Attorney, Agent, or Firm*—Tucker Ellis & West LLP

(57) ABSTRACT

A high-power amplifier having a current-adding array is provided for high-speed driving of an inductive element, e.g., a deflection coil of an electron beam gun. The amplifier includes a first voltage node ($U_1$) and a second voltage node ($U_V$), at least one of which is connected to a regulated power supply, and a plurality of first switchable bridges ($B1_1$, $B1_2$, $B1_3$, . . . , $B1_k$) connected in parallel between the first and second voltage nodes. Each switchable bridge includes at least one resistor ($R1_1$, $R1_2$, $R1_3$, . . . , $R1_k$) with a resistance value that is selected so that a first resistor ($R1_1$) has a first resistance value $WR1_1$ equal to $R_{min}$, a second resistor ($R1_2$) has a second resistance value $WR1_2$ greater than or equal to $WR1_1$ and an n-th resistor has an n-th resistance value $WR1_n$ greater than or equal to $WR1_{n-1}$.

24 Claims, 5 Drawing Sheets

ELECTRON BEAM SYSTEMS

CROSS-REFERENCE

This application claims priority to German patent application no. 10 2006 035 793.0 filed 28 Jul. 2006, the contents of which are incorporated herein as if fully set forth herein.

TECHNICAL FIELD

The present teachings generally relate to electron beam systems for material processing, such as e.g., welding, cutting, hardening or the like. More particularly, the present teachings relate to an amplifier having a current-adding array for high-speed driving of an inductance or inductive element, e.g., a deflecting coil of an electron beam gun. Further, the present teachings also relate to an image generating device for generating an image of a work piece processed by an electron beam system before and/or during the material processing.

BACKGROUND ART

In the state of the art of material processing using electron beams, it is known to drive the deflection coil of the electron beam gun using analog amplifiers that have a high-level signal control frequency of up to 100 kHz. Using known techniques, a precision of the electron beam of 1% (i.e. 1% per mil or 0.1%) can be achieved. However, known analog amplifiers tend to oscillate, over-shoot and level-out during signal level changes/transitions.

U.S. Pat. No. 2,989,614 discloses an electron beam system, which utilizes a current-adding array in order to convert a digital signal into an analog signal. This analog signal must then be amplified using a power analog amplifier before the amplified value is supplied to the deflection coil. Therefore, this known electron beam system suffers from the above-noted problems.

It is further known in the state of the art to display back-scattered electrons, which are back scattered by a work piece processed by the electron beam, on an indicator, such as a display, or to plot the back-scattered electrons using an appropriate recording apparatus, both in a chronologically synchronized manner.

SUMMARY OF THE INVENTION

The present teachings provide, e.g., improved techniques for driving an inductance, such as a deflection coil of an electron beam gun, and improved images generated from back-scattered electrons, which are possible with a high-speed and precise driving of the inductance or deflection coil.

Using the memories that are available today as a result of the development of data processing technology, it is possible to read out data from a memory at up to 30 Mbit/s in a cost-effective manner. A data rate of 1 Mbit/s thus does not represent a technical problem for data processing.

However, with the previously achievable 100 kHz as the control frequency for deflection coils, such a high data rate could not previously be implemented at a correspondingly high deflection rate for deflecting an electron beam of an electron beam gun. Moreover, known analog amplifiers, which allow higher driving frequencies, would be too expensive.

In contrast, a current-adder array and/or an amplifier according to the present teachings provides a type of digital amplifier that makes possible a very high-speed amplification using a summation of a set of generally unregulated currents, which currents may be substantially identical any/or may progressively increase in series. Due to this current-adding arrangement, the present amplifiers have no tendency to oscillate in the relevant frequency range, i.e. in the MHz-range.

With such a current-adding array and/or amplifier, it is possible to use a stored processing- and scanning-pattern for driving the amplifier and/or the current-adding array.

In one embodiment, the resistance values in the current-adding array are preferably selected so that the amounts of the individual, to-be-summed currents (resistance values) become progressively larger (e.g., continuously increase) in the series and the ratio of any 2 of the to-be-added-up currents, which are adjacent in the progression or series of the increasing amounts, is less than or equal to 2 (binary code). More preferably, the ratio is less than 2 for at least some of the respective adjacent currents. In another embodiment, a first set of current ratios of adjacent current sources may be between about 1 and 2, preferably approximately 2, and a second set of current ratios of adjacent current sources may be 1 or approximately 1.

If an arrangement according to the present teachings is utilized, any arbitrary output current is achievable from the set of unregulated currents as a value obtained from at least one, and sometimes also by two or more, summation(s) of two or more unregulated currents, which currents may be different or the same. In embodiments in which a set of different current values is summed or in which two more different to-be-summed currents are generated, although two or more other to-be-summed currents that are identical are utilized, the resolution of the achievable output currents will correspond to the smallest current that is determined by the largest resistance value in the series.

The compensation of preexisting (if present at all) resistance tolerances and/or the compensation of temperature-dependent resistance fluctuations can be achieved, e.g., by a code converter or stored map or look-up table (LUT) that ensures a linear transfer function.

By using a stored processing- and scanning-pattern, which is read out at a high data rate, the generation of an image of the to-be-processed work piece is possible. For example, the electron source can "quasi"-simultaneously process the work piece and can be guided in intervals over the to-be-scanned surface areas of the work piece currently being processed while retaining the welding capillary or capillaries, respectively, in these intervals. A color image can be generated from the registered back-scattered electrons.

Thus, in one advantageous embodiment of the present teachings, an electron beam system that is equipped with a high-speed amplifier, which uses the current-adding array of one the types provided herein, can be controlled very quickly and effectively using the data rates made available by present-day data processing technology. Naturally, improvements in processing technologies and speeds in the future, which are fully contemplated by the present teachings, will only make the present technology more advantageous.

In another advantageous embodiment of the present teachings, the electron beam system can, in addition or in the alternative, generate an image of the surface of the work piece currently being processed by exploiting such high-speed control using an electron beam that is simultaneously used for processing the work piece.

BRIEF DESCRIPTION OF THE DRAWINGS

Further features, embodiments, advantages and objects will be readily derivable from the description of the exemplary embodiments with reference to the Figures, in which.

DETAILED DESCRIPTION OF THE PREFERRED EMBODIMENTS

Figure 1:
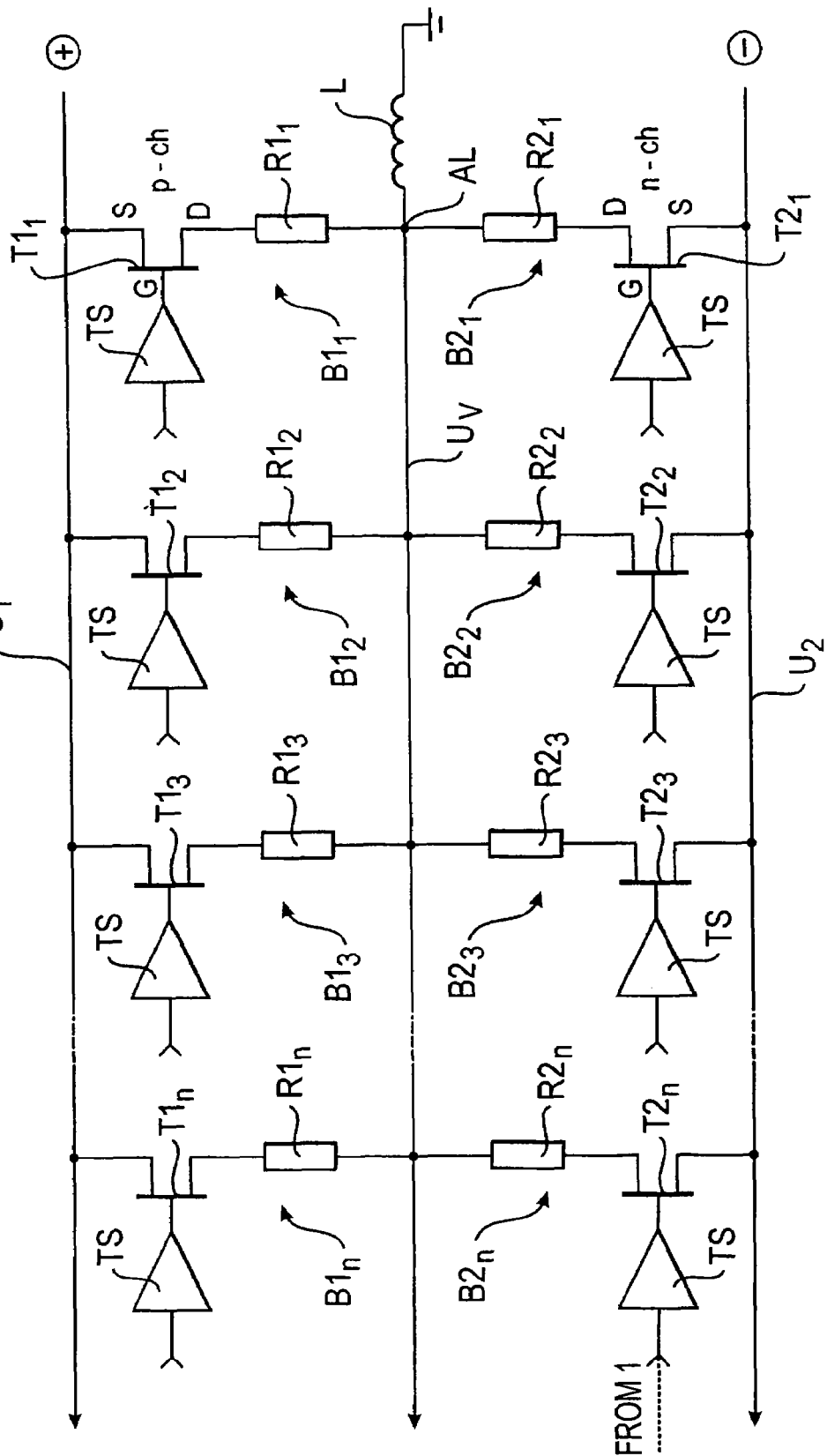
FIG. 1 shows a current-adding array according to a first preferred embodiment of the present teachings.

As will be described in further detail below, the present teachings generally comprise at least the following subject matters:

1. An amplifier for high-speed driving of an inductive element, preferably a deflection coil of an electron beam gun, including a current-adding array preferably having a first voltage node ($U_1$) adapted to be connected with a voltage-stabilized power supply and a second voltage node ($U_V$) adapted to be connected with a first output (AL) for supplying power to the inductive element (L). A plurality of first switchable bridges ($B1_1, B1_2, B1_3, \ldots, B1_k$) preferably each have at least one resistor ($R1_1, R1_2, R1_3, \ldots, R1_k$) with a resistance value that is switchable in parallel between the first voltage node ($U_1$) and the second voltage node ($U_V$). The resistance values are preferably selected so that a first resistor ($R1_1$) has a first resistance value $WR1_1 = R_{min}$, a second resistor ($R1_2$) has a second resistance value $WR1_2 \geq WR1_1$ and the n-th resistor has an n-th resistance value $WR1_n \geq WR1_{n-1}$.

2. An amplifier according to above item 1, preferably including a third voltage node ($U_2$) adapted to be connected with a voltage-stabilized power supply and a plurality of second switchable bridges ($B2_1, B2_2, B2_3, \ldots, B2_k$), which each have a resistor ($R2_1, R2_2, R2_3, \ldots, R2k$) with a resistance value that is switchable in parallel between the third voltage node ($U_2$) and the second voltage node ($U_V$). The resistance values are preferably selected so that a first resistor ($R2_1$) has a first resistance value $WR2_1 = R_{min}$, a second resistor ($R2_2$) has a second resistance value $WR2_2 \geq WR2_1$ and the n-th resistor has an n-th resistance value $WR2_n \geq WR2_{n-1}$.

3. An amplifier according to above item 1 or 2, in which the resistance values are preferably selected so that the second resistor ($Ri_2$) has a second resistance value $WRi_2 = m_2 R_{min}$, $2 \geq m_2 \geq 1$, i=1, 2 and the n-th resistor ($Ri_n$) has an n-th resistance value $WR1_n = m_n^{n-1} R_{min}$, $2 \geq m_n \geq 1$.

4. An amplifier according to above item 3, wherein $m_n \geq m_n - 1$, and/or $m_n = m_{n+1}$ for n≥3, 4, 5, 6, . . . .

5. An amplifier according any one of above items 2 to 4, wherein the first voltage node ($U_1$) is preferably adapted to be connected with an output of a first polarity (e.g., + or plus) of the voltage-stabilized power supply and the third voltage node ($U_2$) is preferably adapted to be connected with an output of a second polarity (e.g., − or minus) of the voltage-stabilized power supply.

6. An amplifier according any one of above items 1 to 5, wherein the switchable bridges ($B1_1, B1_2, B1_3, \ldots, B1_k, B2_1, B2_2, B2_3, \ldots, B2_k$) are preferably each comprised of a parallel-connection of the resistor ($R1_1, R1_2, R1_3, \ldots, R1_k, R2_1, R2_2, R2_3, \ldots, R2k$) and a high-speed switch ($T1_1, T1_2, T1_3, \ldots, T1_k, T2_1, T2_2, T2_3, \ldots, T2_k$).

7. An amplifier according any one of above items 1 to 6, further preferably including a control circuit (1) adapted for driving the switchable bridges ($B1_1, B1_2, B1_3, \ldots, B1_k, B2_1, B2_2, B2_3, \ldots, B2_k$). More preferably, the control circuit may be designed to separately and independently drive each of the switchable bridges.

8. An amplifier according to above item 7, wherein the control circuit (1) preferably further includes a data input (3) for receiving a first data word having a first bit count and a code converter (6), which is connectable with the data input and is adapted to convert, according to a predetermined conversion rule, an input data word having the first bit count into an output data word having a second bit count for driving the switchable bridges ($B1_1, B1_2, B1_3, \ldots, B1_k, B2_1, B2_2, B2_3, \ldots, B2_k$). An A/D converter (7) is preferably connected with the first output (AL) and preferably outputs a second data word having the first bit count. A comparator circuit (8) preferably compares the first and second data words and outputs a comparison result. An auxiliary amplifier (9) preferably has an output connected with the first output (AL) and the input of the auxiliary amplifier preferably receives an input signal that corresponds to the comparison result.

9. An amplifier according to above item 7, which preferably further includes an adjusting control circuit (5), which receives the comparison result from the comparator circuit (8) and is adapted to influence the output of the code converter (6) so that the first data word and the second data word are harmonized.

10. An amplifier according to any one of above items 7 to 9, wherein the control circuit (1) is preferably adapted to over-drive the current-adding array, which is adapted, in duration and amplitude, to an amount of a change of the current that is to-be-output at the first output (AL).

11. An amplifier according any one of above items 1 to 10, which preferably further includes a circuit for short-circuiting the inductance (L) close to its low end, which low end opposes the first output (AL), during a switching operation of the switchable bridges ($B1_1, B1_2, B1_3, \ldots, B1_k, B2_1, B2_2, B2_3, \ldots, B2_k$).

12. An amplifier according any one of above items 1 to 12, which preferably includes a first current-adding array according to any one of above items 1 to 6, whose first output (AL) is a first coil terminal, and a second current-adding array according to any one of above items 1 to 6, whose first output (AL) is a second coil terminal. The control circuit (1) according to one of above items 7 to 11 is preferably included and designed for driving said first current-adding array and said second current-adding array.

13. An image generating device for an electron beam system for material processing and being adapted to generate an image of a work piece processed with an electron beam gun while the work piece is being processed. The electron beam gun preferably includes a deflection device for controlling the deflection of an electron beam. The image generating device preferably includes a memory for storing a digital processing- and scanning-pattern, which pattern defines a path of an electron beam (e) in a processing- and scanning-area on the work piece. A control circuit (1, 2) is preferably adapted to drive the deflection device for deflecting the electron beam (e) according to the stored processing- and scanning-pattern. A sensor system preferably has two sensors (S1, S2) that are designed to independently detect electrons, which are back-scattered from the work piece during the processing, and to output an output signal, which represents the intensity of the detected back-scattered electrons. Further, an evaluation circuit (17-20) preferably generates a differential signal from the output signals of the two sensors (S1, S2) and preferably generates an image from the differential signal, which image depicts the processing- and scanning-area such that the differential signal can be displayed in a first color and the inverse differential signal can be simultaneously displayed in a second color.

14. An image generating device according to above item 13, wherein the evaluation circuit preferably includes a first pre-amplifier (17) having an input, which is connected with one of the sensors (S1), a second pre-amplifier (17) having an input, which is connected with the other sensor (S2) and a differential amplifier (18), whose inputs are connected with the outputs of the two pre-amplifiers (17, 17). A power amplifier (19) preferably includes an input, which is connected with the output of the differential amplifier (18), and two push-pull outputs (19a, 19b).

15. An image generating device according to above item 13 or 14, wherein the evaluation circuit is preferably adapted to change the colors, in which the differential signal and the inverse differential signal are simultaneously displayed.

16. An electron beam system preferably includes an electron beam gun (11, 12, 13) having a first deflection coil for deflecting an electron beam (e) in a first direction (14) and a second deflection coil for deflecting the electron beam (e) in a second direction (15). An amplifier according to above item 12 is preferably included and has a first coil terminal connected with the first deflection coil and a second coil terminal connected with the second deflection coil. A memory stores a digital processing- and scanning-pattern, which defines a path of the electron beam (e) in a processing- and scanning-area on a work piece to be processed using the electron beam gun. Further, the control circuit (1, 2) of above item 12 is preferably adapted for driving the deflection coils in order to deflect the electron beam according to the processing- and scanning-pattern.

17. An electron beam system according to above item 16, which preferably comprises a sensor system having two sensors (S1, S2) that are designed to independently detect electrons, which are back-scattered from the work piece during the processing with the electron beam (e), and to output an output signal, which represents the intensity of the detected back-scattered electrons. An evaluation circuit (17-20) preferably generates a differential signal from the output signals of the two sensors and preferably generates an image from the differential signal, which image depicts the processing- and scanning-area such that the differential signal can be displayed in a first color and the inverse differential signal can be simultaneously displayed in a second color.

18. An electron beam system according to above item 17, wherein the evaluation circuit preferably includes a first pre-amplifier (17) having an input, which is connected with one of the sensors (S1), a second pre-amplifier (17) having an input, which is connected with the other sensor (S2), a differential amplifier (18), whose inputs are connected with the outputs of the two pre-amplifiers (17, 17). A power amplifier (19) preferably includes an input, which is connected with the output of the differential amplifier (18), and two push-pull outputs (19a, 19b).

19. An electron beam system according to above item 17 or 18, wherein the evaluation circuit is preferably adapted to change the colors, in which the differential signal and the inverse differential signal are simultaneously displayed.

Each of the additional features and teachings disclosed below may be utilized separately or in conjunction with other features and teachings to provide improved amplifiers, current-adding devices, electron guns and image generating devices, as well as other subject matter disclosed to the skilled person by the present teachings. Representative examples of the present invention, which examples utilize many of these additional features and teachings both separately and in conjunction, will now be described in further detail with reference to the attached drawings. This detailed description is merely intended to teach a person of skill in the art further details for practicing preferred aspects of the present teachings and is not intended to limit the spirit or scope of the invention. Moreover, combinations of features and steps disclosed in the following detail description may not be necessary to practice the invention in the broadest sense, and are instead taught merely to particularly describe representative examples of the invention. Further, various features of the above-described and below-described representative examples, as well as the various independent and dependent claims, may be combined in ways that are not specifically and explicitly enumerated in order to provide additional useful embodiments of the present teachings. All features disclosed in the description and/or the claims are intended to be disclosed separately and independently from each other for the purpose of original written disclosure, as well as for the purpose of restricting the claimed subject matter, independent of the compositions of the features in the embodiments and/or the claims. In addition, all value ranges or indications of groups of entities are intended to disclose every possible intermediate value or intermediate entity for the purpose of original written disclosure, as well as for the purpose of restricting the claimed subject matter.

A first preferred embodiment of an amplifier (e.g., a current-adding array) for high-speed driving of an inductive element, such as a deflection coil of an electron beam gun, is shown in FIG. 1. The amplifier (current-adding array) preferably directly drives the inductive element, i.e. without any intervening analog amplifiers or other similar signal processing devices connected between the amplifier and the inductive element.

In the following description, a data element (Byte) consisting of Z bits (Z=positive integer) is called a "data word."

The current-adding array of FIG. 1 includes a first voltage node $U_1$ that is connectable with an output, e.g., the plus (+)-output, of a voltage-stabilized power supply (not shown). The current-adding array includes a second voltage node $U_V$, which is connectable with an output AL that is connected to a terminal of the inductive element L. Switchable bridges $B1_1$, $B1_2$, ..., $B1_k$, respectively, are provided in parallel between the first voltage node $U_1$ and the second voltage node $U_V$, wherein k is a positive integer, e.g., 7 or 8; in this embodiment, the bridges are each comprised of at least one transistor $T1_1, T1_2, \ldots, T1_k$ and at least one resistor $R1_1, R1_2, \ldots, R1_k$.

Transistors in the ON state have very low ohmic values in comparison to the current-determining resistors utilized herein. Therefore, the influence of the transistors in the ON state is compensated within the range of compensation of the resistance value tolerances, as will be explained further below.

The resistance value of the first resistor $R1_1$ has the lowest resistance value $R_{min}$ of the resistors $R1_1, R1_2, \ldots$. The second resistor $R2_2$ preferably has a resistance value $WR1_2 = mR_{min}$, wherein $2 \geq m \geq 1$. The last resistor $R1_n$ has an nth resistance value $WR1_n = m^{n-1} R_{min}$. For this embodiment, we will assume m=1.9. In this first preferred embodiment, it generally suffices that the choice of the resistance values is made such that the amounts of the individual, to-be-added-up currents (resistance values) continuously (progressively) increase and the ratio of each 2 of the to-be-added-up currents, which are adjacent in the series of the increasing amounts, less than or equal to 2 (binary code), more preferably less than 2. In this case, every possible output current value is achievable by adding (if necessary) two or more of the unregulated currents (addition of regulated currents is also contemplated by the present teachings, if a particularly precise total or summed output current is desirable). When two or more different currents (or different current sources) are summed to achieve the total output current value of the current-adding array, the resolution of the achievable current values substantially corresponds to the (smallest) current determined by the largest resistance value.

In the first preferred embodiment, the resistance values are preferably selected so that the resistance values $WR1_j = m_j^{j-1} R_{min}$, (more precisely, $WR1_j = m_j \times m_{j-1} \times \ldots \times m_2 \times m_1 \times R_{min}$), wherein $j=1, 2, \ldots, k$ and $2 \geq m_j \geq 1$. It is possible, although not necessary, to select an identical value for all $m_j$, such as e.g., $m_j = 1.9$ for some or all j in the above example (or $m_j = 1$ in the second and third preferred embodiments discussed below).

In the embodiment shown in FIG. 1, in which the first voltage node $U_1$ is connected with the plus (+)-terminal of the voltage-stabilized power supply (not shown), the switches $T1_1, T1_2, \ldots$, are preferably p-channel-FETs. In the alternative, e.g., IGBTs or other high-speed switches having a low ON resistance value could be used.

In the embodiment shown in FIG. 1, a third voltage node $U_2$ is provided that is provided for connection with the minus (−)-terminal of the voltage-stabilized power supply. Switchable bridges $B2_1, B2_2, \ldots, B2_k$, are provided between the second voltage node $U_V$ and the third voltage node $U_2$, in a manner similar to the bridges $B1_1, B1_2, \ldots, B1_k$ provided between the first and the second voltage nodes. In this exemplary embodiment, the switchable bridges are again comprised of a switch formed by at least one transistor and at least one resistor. The bridges are connected in series between the two voltage nodes $U_V, U_2$. The transistor $T2_1$-$T2_n$ of each switchable bridge between the second and the third voltage nodes $U_V, U_2$ is preferably formed as an n-channel FET, although other types of switches, of course, within the scope of the present teachings. Analogous to the bridges between the first and second voltage nodes $U_1, U_V$, the resistance values of these resistors are preferably selected so that $WR2_1 = R_{min}$, $WR2_2 = mR_{min}$ and $WR2_n = m^{n-1} R_{min}$. Of course, the above-mentioned alternatives and modifications are also applicable to these bridges.

Figure 2:
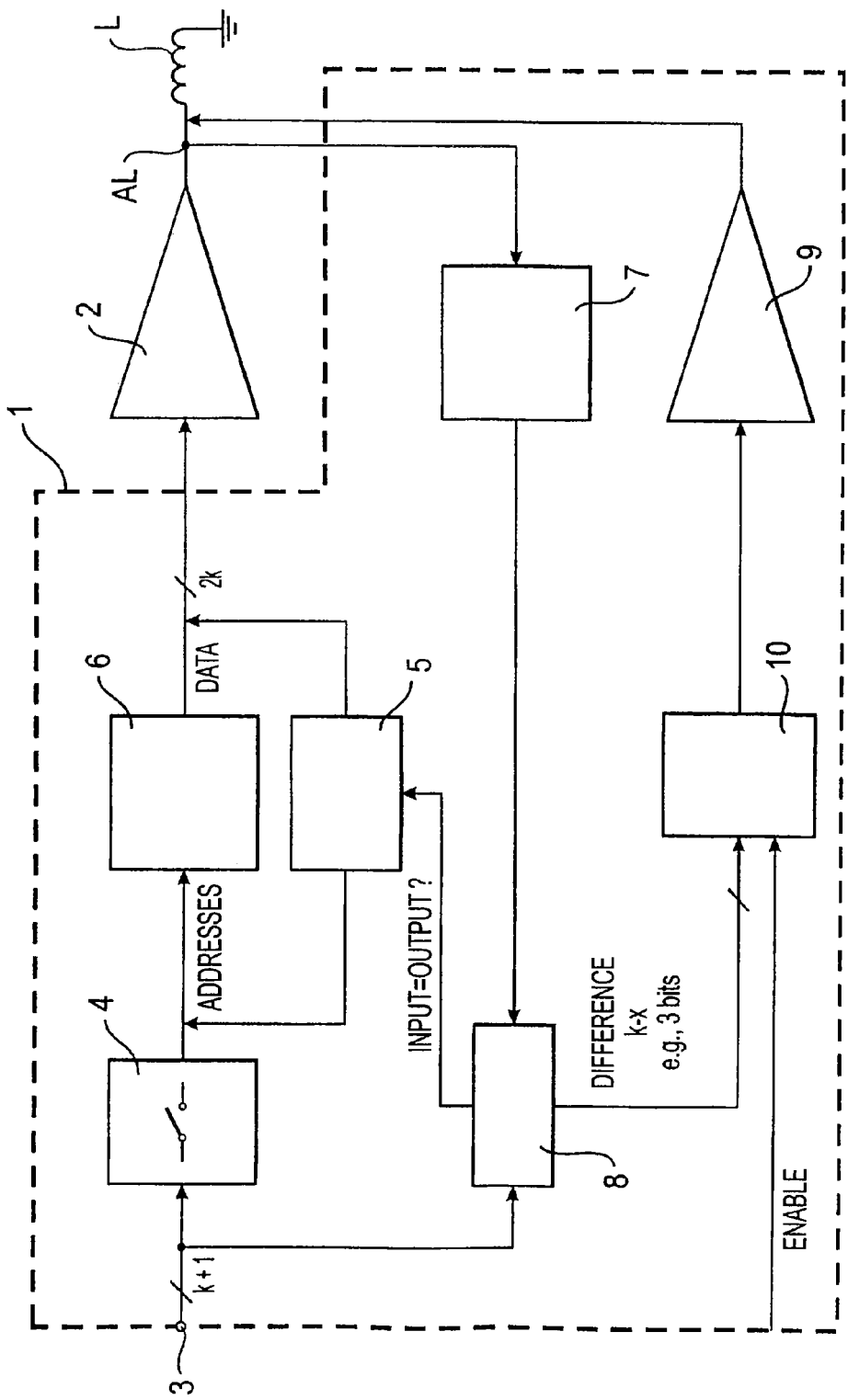
FIG. 2 shows a block diagram of a representative current-adding array with additional control circuitry.

The switches, i.e. the transistors $T1_1, \ldots, T2_1, \ldots$, shown in FIG. 1, are controlled by a control circuit 1 shown in FIG. 2. Each bit of an output signal (data word) of the control circuit 1 is applied to a corresponding one of the driving switches TS that are represented as a triangle in FIG. 1. The driving switches TS are respectively connected with the gates of the FETs. The switches can also be implemented in another way as long as a short switching time (e.g., <1 is, preferably <50 ns, still more preferably ≦30 ns) and a low ON resistance value are ensured.

This control circuit 1 can thus use a data word having 2 k bits for controlling the current-adding array of FIG. 1, wherein each individual binary bit of the data word represents the turned-ON (e.g., 1) and turned-OFF (e.g., 0) states, respectively, of one transistor. If the current-adding array of FIG. 1 includes only two voltage nodes (e.g., only $U_1$ and $U_V$) and thus k switchable bridges, then one data word having k bits suffices for driving the k switches. Herein, k is preferably a positive integer within the range of 2 to 20, more preferably 4 to 12. However, as device sizes continue to be miniaturized, larger values of k are certainly possible and advantageous. Therefore, for all intents and purposes, k has no upper limit.

The selection of the resistance values of the current-determining resistors $R1_1, \ldots$ is relatively simple. The current-determining resistors should, however, have a relatively low inductance. Of course, while it is possible to select resistors having very low tolerances, this is not necessary in particularly preferred embodiments of the present teachings, because the tolerances can be easily compensated by the below-described control circuit.

With the current-adding array of the first preferred embodiment, any arbitrary current up to the total sum of the currents, which total sum is obtained by switching ON all bridges of one polarity, can be achieved. The resolution of the current increments is determined by $R_{min}$.

In the range of the low currents, e.g., the lowest 3 or 4 bits, the to-be-summed currents (or current sources) could also be selected or generated precisely in the ratio 1:2:4 (i.e. m=2). In this range, the manufacturing tolerances and the temperature drift have no significant influence on the resulting output current value. In the range of higher currents, i.e. the higher-significance bits of the data word encoding the target current value, the ratio of the to-be-added-up currents preferably are less than 1:2. This is the reason why the value m=1.9 was selected in the first preferred embodiment.

As one exemplary embodiment, if a resolution of the adjustable current values of 12 bits ($=2^{12}=4096=64\times 64=2^6 \times 2^6$) should be achieved, then one bit more per current direction (=7 bits) must be used for the encoding due to the selection of the ratio of 1.9, because $1.9^7$ equals 89, which is greater than 64. Since $1.9^6$ only amounts to 47, which is less than 64, 6 bits per current direction would be insufficient to achieve a resolution of 12 bits. That is, k=7 for m=1.9, instead of k=6, would be necessary for a resolution of 12 bits.

Moreover, if 6 bits are mapped precisely in a binary manner, i.e. m=2, and a further 6 bits are mapped with m=1.8, then the amplifier would have a resolution of 12 bits, if the number of bits of the data word is considered to be the measure of the resolution. However, the amplifier would have a resolution of 11 bits (somewhat more) if the range of the adjustable current values is considered to be the measure of the resolution ($2^6 \times 1.8^6 = 2176 > 2048 = 2^{11}$).

Variable ratios, which become smaller in the direction of increasing currents, are advantageous in practice (i.e. $m_j < m_j + 1$ for small j), because the resistance values of the turned-ON transistors, the deflection coil and the connecting wires become more important in the range of higher currents.

The time constant of a system comprised of the inductive element L and a switchable bridge $B1_1, \ldots$ is given by $\tau = L/R$. As a result, the current asymptotically approaches its end value according to the equation:

$$I = I_0(1 - \exp(-t/\tau)).$$

After expiration of six time constants, an electron beam position supplied from a 50 mm distance would miss the desired target by only 125 μm. However, if the amplifier (the current-adding array) is initially over-driven using a proportional factor for the duration of one time constant τ, then the end value is already achieved after a single time constant.

With an inductivity of L=5 μH, a voltage of the voltage-stabilized power supply of U=40V and a maximum current of I=8 A per bridge, it is derived that the smallest resistance $R_{min}$ is 5Ω and one time constant τ=1 μs.

This forward control without feedback avoids all tendency of the amplifier to oscillate.

For achieving the desired precision, i.e. the increments between the currents obtained by summation and the linearity of the curve, a current-adding array having the control circuit shown in FIG. 2 preferably can be used.

A current-adding array of the type shown in FIG. 1 is shown in FIG. 2 as amplifier 2. The control circuit 1 is encircled with a dotted line in FIG. 2.

The control circuit 1 of FIG. 2 has a data input 3 for receiving a first data word having a first bit count k+1 (i.e.

k+sign). The data input 3 is connected with a switch 4 and a comparator circuit 8. The switch 4 is designed to connect the first data word to an EEPROM 6. The output of the EEPROM 6, which memory represents a code converter or a map or a look-up table (LUT), is connected with the input of the amplifier 2. The output AL of the amplifier 2 is connected with the inductive element L, e.g. a coil, more preferably a deflection coil. Furthermore, an analog-to-digital converter 7 is connected with the output AL, which A/D converter 7 outputs a second data word having the first bit count. The comparator circuit 8 receives the first data word from the data input 3 and the second data word from the A/D converter 7. The comparator circuit 8 is designed to compare these two data words and to output the comparison result, i.e. the difference between these two data words, which also includes the difference 0 (i.e. identity of the two input values).

The comparator circuit 8 is constructed so that, in normal operation, the comparison result is output, on the one hand, to an adjusting control circuit 5 as a data word having the same bit count as the first data word (k+1) for adjusting and/or programming of the EEPROM 6 and, on the other hand, to an auxiliary amplifier 9 via a low pass filter 10 as a data word having a lower bit count k−x, e.g., 3 or 4. The auxiliary amplifier 9 is preferably designed in the same way as the amplifier 2, but with fewer bridges (e.g., (k−x−1) per current direction). That is, the auxiliary amplifier 9 may be a type of mini-embodiment of amplifier 2.

A first amplifier adjustment is performed at the time of initial set-up of the amplifier arrangement 1, 2 or always when some circuit component is modified, exchanged or repaired that may affect the controlled inductivity, such as e.g., the coil system of an electron beam gun, or the connecting wires or the amplifier arrangement. The switch 4 is opened for this adjustment purpose. The adjusting control circuitry 5 inputs all possible bit combinations (e.g., $2^{12}$=4096 for k=12) in succession as input values to the amplifier 2, until the output current corresponding to each input value becomes constant, e.g., for 10 time constants. The actually-flowing output current of the amplifier 2 is measured for all possible bit combinations and each measured value is converted by the A/D converter 7. The value 0 is preferably supplied to the comparison circuit 8 as the first data word, so that the second data word is output from the comparison circuit 8 to the adjusting control circuit 5 as the difference. The adjusting control circuit 5 then searches in the neighborhood of the just-supplied 12 bit data word (i.e. the 12 transistor inputs of one polarity) according to the bit combination, which compensates all amplifier errors and supplies the target current. For each possible 12-bit-combination per current direction (i.e. 13 bits with the sign of the polarity) at the input of the EEPROM 6, a 12-bit combination is thus searched that must be received by the current-adding array 2 in order to supply the target current output value. This process is performed individually for each current direction.

The results are stored in the EEPROM 6. In later operation, the corresponding 12-bit data word corresponding to the current direction is output for each of the 4096 12-bit addresses. The other respective 12-bits have the logical L (low) level that leaves the other half of the amplifier unused.

A table or map is thus stored in the EEPROM 6, which table or map stores each data word having a bit count 2 k corresponding to each target current output value, which is encoded by the first data word, as an output data word for driving the switchable bridges.

However, even when an identical data word is input, the current value output by the amplifier can differ from the target current value due to resistance tolerances and/or temperature drift. The second function of the control circuit 1 is provided for correcting such differences so that the proper target current is output. In normal operation, the switch 4 is closed and the EEPROM 6 is driven via the input 3. The second function does not utilize the adjusting control circuit 5. It implements a (comparatively small) correction of the output current value during the normal operation (e.g., compensation of the temperature-dependent changes of a resistance value). This compensation can be performed by the auxiliary amplifier 9, which is driven via the low-pass filter 10, after being enabled, with a data word of, e.g., 3 (or 4 or 5) bits. This lower bit-count data word is derived by the comparator circuit 8 from the difference between the first and the second data words.

Due to the high-speed driving of the amplifier 2 made possible by the present teachings, an adjustment for correcting these deviations can also take place during very short work pauses that take place while processing a work piece in order to compensate for temperature-dependent resistance changes. For this purpose, as was already described, the first data word is compared with the second data word and the output of the code converter 6 is adjusted accordingly.

The advantage of this procedure is the temporary decoupling of the regulation, which generates the correct output value for each input value, of the required, very high-speed operation of the amplifier. Such a design can result in no regulating oscillation being generated. When using a 12-bit input data word per amplifier side for the amplifier 2, one has practically 4096 value increments available in order to correct all static inaccuracies. The dynamic characteristics of the system are described substantially with the (very small) time constant r.

Instead of using feedback supplied via the A/D converter 7, it is also possible to obtain the feedback by measuring the impact locations of the electrons in the working chamber, for example, using a wire mesh (or wire grid) having wires isolated from each other. With such a feedback arrangement, errors that are temperature dependent and are physically unavoidable due to the limited coil cross-sections, such as pillow cushion distortion (e.g. hour glass effects), can be compensated. In this case, all 24 bits for the X-direction and the Y-direction can be used together for addressing a memory having 16 M×3 bits, and the 24-bit data are again used for driving the two nodes of amplifier 2.

In summary, the current-adding array, which is usable as a high-speed amplifier for high-speed driving of an inductance, preferably a deflection coil of an electron beam gun, makes possible the addition of individual, respectively-unregulated currents of known amounts into a total current. This further makes possible a high-speed and reliable "amplification", more precisely, the outputs, of a controllable current having a constant voltage due to the very small realizable time constants for the system.

The ratio of each two of the to-be-added-up currents is preferably equal to or less than 2 (also, e.g., equal to 1), which forms a kind of binary code of to-be-added-up currents. In some embodiments, this ratio may increase in the direction that the values of the to-be-switched currents become smaller.

A linear transfer function of the amplifier and/or the current-adding circuitry is achieved, e.g., by a code converter (map or LUT) that compensates manufacturing-dependent resistance value tolerances and, after activation of the amplifier, compensates the temperature-dependent resistance value changes using the currents later to be realized in thermal equilibrium.

Dynamic load changes at the high-current resistors in the range of the relatively large time constants for thermally-dependent resistance value changes can be regulated by the control circuit with a relatively low speed so that an oscillation-tendency, which is caused by feedback in this regulator circuit, is excluded.

For continuous current changes, the coil can be short-circuited close to its low end, while a switching process is taking place in the amplifier, such that the current flowing in the coil is maintained with a large time constant.

With such a high-speed amplifier, image generation and evaluation of the back-scattered electrons is also possible using the electron beam system for material processing by scanning of the surface of the work piece located in processing with the same electron beam, which is used at the same time for processing the work piece.

Figure 3:
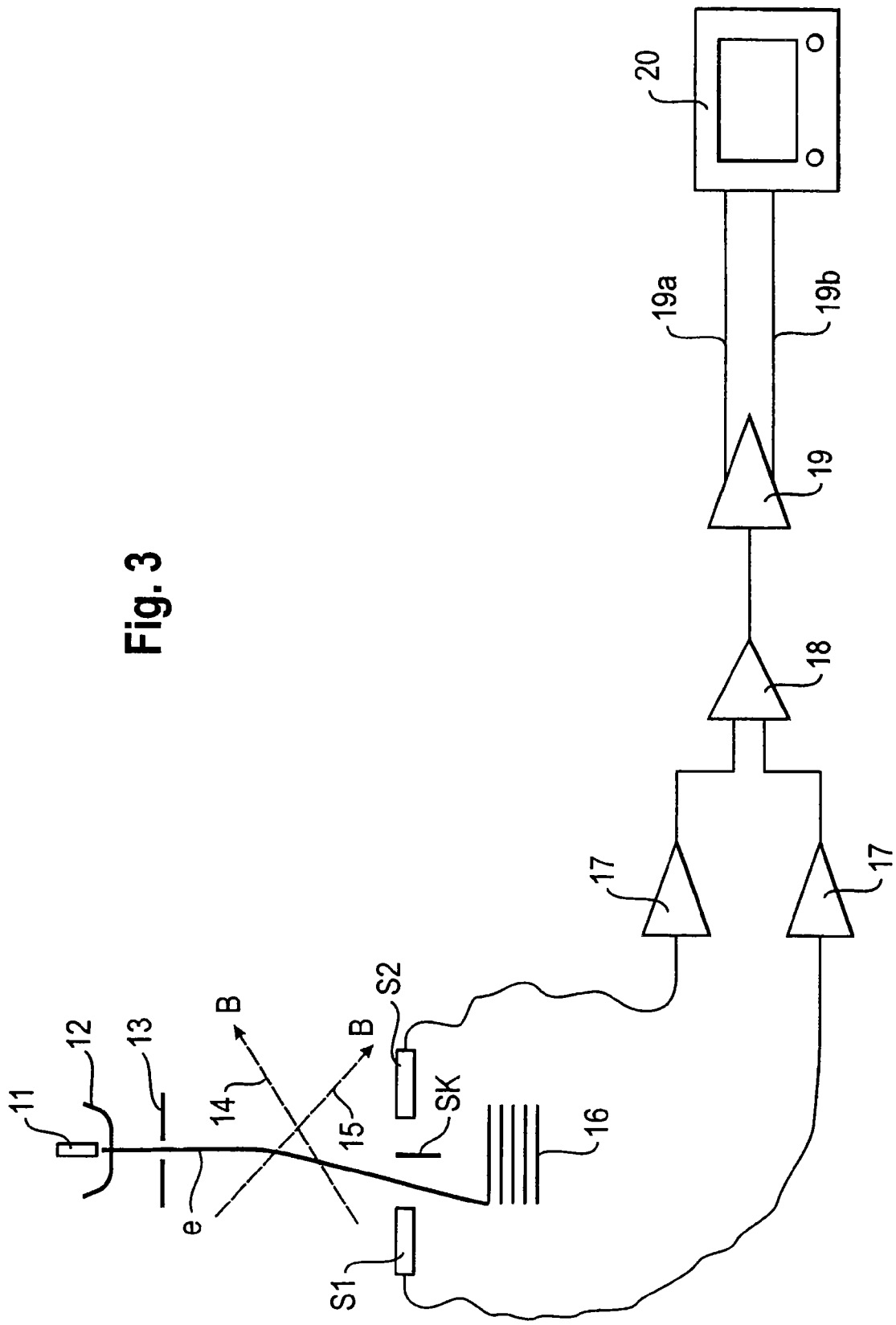
FIG. 3 shows a schematic illustration of a preferred electron beam system with an image generating device.

FIG. 3 schematically shows such an electron beam system. An electron beam e is generated by cathode 11, a so-called "Wehnelt electrode" (e.g., a modulator electrode) 12 and anode 13. The direction of the electron beam is controlled by the perpendicular magnetic fields 14, 15 that are generated by the deflection coils of the electron beam gun.

During the weld processing of a work piece, a welding capillary SK is generated. While maintaining the welding capillary SK, the beam can be scanned onto the to-be-scanned surface areas of the work piece in short time intervals using a scanning pattern 16, so that an image of the scanned surface area can be generated by detecting the back-scattered electrons.

For this image generation purpose, the electron beam system includes two sensors S1, S2 that are adapted to detect back-scattered electrons independently from each other. The sensors S1, S2 each generate an output signal that corresponds to the intensity of the back-scattered electrons that are detected by the respective sensors. The output signals of the sensors S1, S2 are respectively supplied to the inputs of each pre-amplifier 17. The output signals of the two pre-amplifiers 17 are respectively supplied to the two inputs of the differential amplifier 18. The output signal of the differential amplifier 18 is supplied to the input of a power amplifier 19 that has two "push-pull" outputs. The amplified input signal of the power amplifier 19 is output at one of the push-pull outputs. The amplified input signal of the power amplifier 19 with the opposite sign is output to the other push-pull output. In other words, the power amplifier 19 outputs the amplified differential signal and the inverse (or negative) amplified differential signal.

With these two signals, a color image can, e.g., be generated on a display with an RGB-input, in which the one signal is represented as red and the other signal is represented as green. The color presentation produces the visual impression of an obliquely-illuminated scenery, similar to a colorized land map with emphasized mountains and valleys. Optical illusions are thus avoided that, in a gray-value presentation, do not permit the differentiation of the hole of a punch or funnel impact shape from a cone-shaped elevation. Operating errors can thus be avoided.

In the alternative, it is possible to digitally perform the signal evaluation, i.e. to select a digital representation of the sensor signals that are then either stored in digital form or are presented on a digital image display.

The transition from analog to digital signal processing is, in principle, possible at each position between the sensors S1, S2 and the outputs of the power amplifier 19.

An electron beam system having an electron beam gun with deflection coils, a current-adding array of the above-described type for driving the deflection coils, and an image generating device of the above-described type makes possible, on the one hand, a very high-speed and precise control of the beam direction with a repeatable precision that is achievable only with difficulty using analog amplifiers, which repeatable precision was not possible with known technology, and on the other hand, it makes possible the generation of a digital image of surface areas of interest. These two advantages can be achieved independently of each other.

Ultimately, the data words used to drive the current-adding array represent a type of bitmap and thus a map of the to-be-scanned work piece. If a correlation between the detected back-scattered electrons and the driving of the current-adding array is produced, then each corresponding data pair, which is comprised of a data word and a sensor value, defines each respective point of a back-scattered electron intensity map.

This map can be even more precisely designed in that, instead of the first data word that is input into the control circuit 1, the second data word, which is obtained from the coil current actually output by the amplifier 2, is utilized for the production or generation of the map. An image memory can also be filled in a pixel-by-pixel manner with the obtained sensor values.

Such a pictorial representation of the scanned surface areas can provide significant areas for further analysis, on the one hand, for visual inspection and on the other hand, for quality-management purposes and also for beam correction purposes.

The use of the current-adding array for driving the deflection coils thus provides, in combination with the image generating device, a particularly preferred embodiment of the image generating device, because the bitmap, with which the current-adding array is driven, also can be used for the image generation in the above-described manner.

Figure 4:
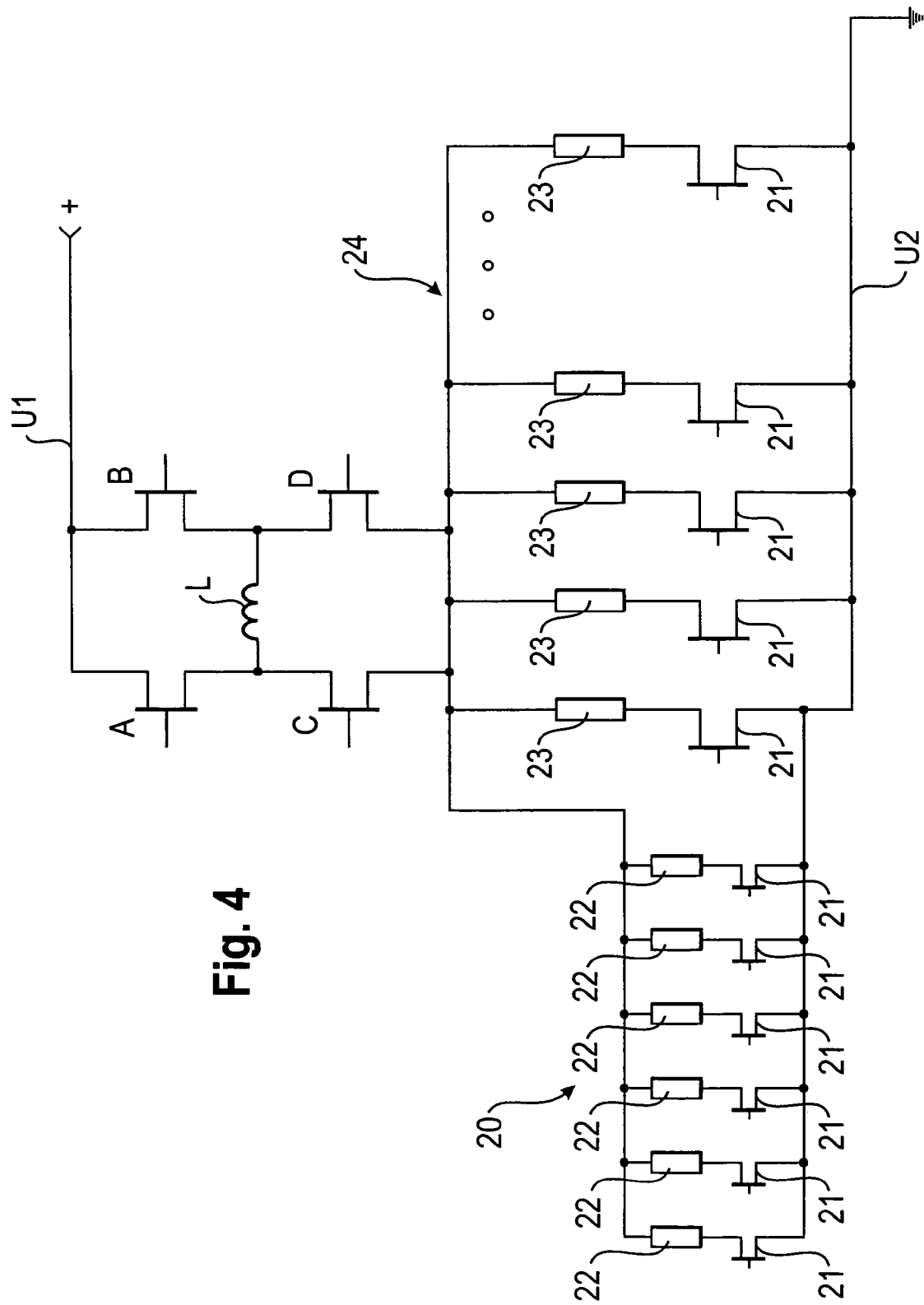
FIG. 4 shows a current-adding array according to a second preferred embodiment of the present teachings.

A second preferred embodiment of an amplifier (e.g., a current-adding array) for high-speed driving of an inductive element, such as a deflection coil of an electron beam gun, is shown in FIG. 4. Like the first preferred embodiment, the amplifier (current-adding array) of the second preferred embodiment also preferably directly drives the inductive element L, i.e. without any intervening analog amplifiers or other similar signal processing devices connected between the amplifier and the inductive element.

The current-adding array of FIG. 4 again includes a first voltage node U1 that is connectable with an output, e.g., the plus (+)-output, of a voltage-stabilized (e.g., regulated) power supply (not shown). The current-adding array includes a second voltage node U2, which is connectable with a ground or e.g., the negative (−)-output of the voltage-stabilized power supply. Switchable bridges are again provided between the first voltage node U1 and the second voltage node U2; each bridge is comprised of at least one transistor 21 and at least one resistor 22 or 23 and the respective bridges are connected in parallel between the two voltage nodes.

In the second preferred embodiment, the switchable bridges in the left-side current array 20 of FIG. 4 are preferably comprised of resistors 22 that have increasing resistance values, the values generally increasing in ratios between about 1 to about 2 as in the first preferred embodiment. For example, the resistors 22 may be provided in resistance value ratios of approximately 1:2:4:8:16, etc. The number of switchable bridges in the left-side current array 20 having increasing resistance values is not particularly limited, although in a particularly preferred embodiment, six switchable bridges with increasing resistances 22 are provided in resistance value ratios of about 1:2:4:7.5:15:30. Generally, the number of switchable bridges in the left-side current array 20 may be between 2 and 32, more preferably between 4 and 16.

Furthermore, the power supply and the respective resistance values of resistors 22 are preferably selected to respectively generate individual currents of, e.g., approximately 1, 2, 4, 7.5, 15 and 30 mA. This preferred left-side current array 20 is controlled or switched according to a 6-bit data word and is capable of generating approximately 6-bit resolution of the resulting total or summed output currents. As will be apparent, the switchable bridge having the lowest resistance value (thus generating the highest current) is preferably switched according to the most significant bit of the multi-bit data word and the switchable bridge having the highest resistance (thus generating the lowest current) is preferably switched according to the least significant bit of the multi-bit data word.

The further teachings in accordance with the first preferred embodiment are fully applicable to the left-side current array 20 and thus need not be repeated again for the second preferred embodiment.

The switchable bridges of a right-side current array 24 of FIG. 4 are preferably comprised of resistors 23 that have the same or substantially the same resistance value. Again, the number of switchable bridges, which are each comprised of at least one transistor 21 and at least one resistor 23, is not limited, but in a particularly preferred embodiment, 128 switchable bridges are provided, each capable of outputting a current of about 60 mA. This right-side switchable bridge arrangement 24 is adapted to be switched or controlled by a 7-bit data word (i.e. 128 binary words), which thus provides 128 different possible total or summed output currents. More generally, the number of switchable bridges in the right-side current array 24 may be preferably between 2 and 512, more preferably between 16 and 256, even more preferably between about 64 and 128.

The two current-adding arrays 20, 24 of FIG. 4, when operated together, are capable of an overall resolution of about 14 bits (i.e. 6+7=13 bits plus sign/polarity) in accordance with the resolution calculations discussed above with respect to the first preferred embodiment. In this regard, it is noted that the right-side current array 24 is preferably arranged and constructed to generate larger currents than the left-side current array 20, i.e. the right-side current array 24 may be preferably switched according to the most-significant bits and the left-side current array 20 may be switched according to the least-significant bits.

In such a preferred embodiment, when the large currents are generated via switchable bridges that generate approximately the same output currents, larger total or summed output currents can be generated simply by switching ON additional transistors 21 in the right-side current array 24. Thus, the design of the second preferred embodiment is capable of generating smoother current curves, which is particularly advantageous when the present current-adding arrays are utilized for image scanning of the component or work piece being processed by the electron beam system.

In order to change the polarity across the coil L, in a first polarity mode, transistors A and D are switched ON together and in a second polarity mode, transistors B and C are switched ON together, thereby enabling an alternating current to be supplied to the coil L. In addition, while various types of transistors, e.g., power transistors may be utilized for transistors 21 and A-D, Field Programmable Gate Arrays (FGPA) are preferred. More preferably, transistors A-D should have relatively high current and voltage ratings, as some embodiments of the present teachings are intended to be capable of delivering several amps (e.g., 2-10 amps) and substantial voltages (e.g., 10-200 volts).

Figure 5:
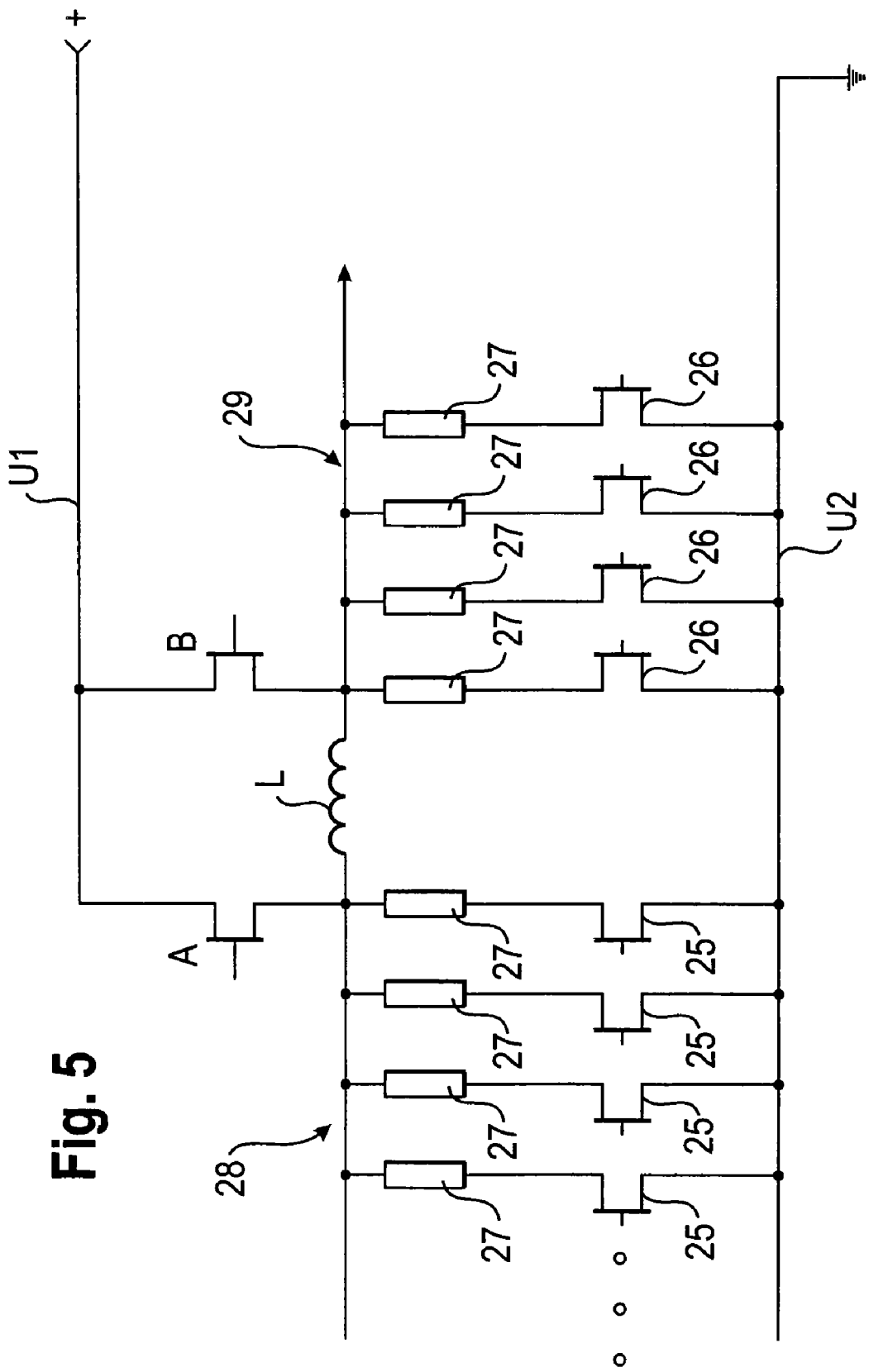
FIG. 5 shows a current-adding array according to a third preferred embodiment of the present teachings.

A third preferred embodiment of an amplifier (e.g., a current-adding array) for high-speed driving of an inductive element, such as a deflection coil of an electron beam gun, is shown in FIG. 5. Like the first and second preferred embodiments, the amplifier (current-adding array) of the third preferred embodiment also preferably directly drives the inductive element L, i.e. without any intervening analog amplifiers or other similar signal processing devices connected between the amplifier and the inductive element.

The current-adding array of FIG. 5 again includes a first voltage node U1 that is connectable with an output, e.g., the plus (+)-output, of a voltage-stabilized (e.g., regulated) power supply (not shown). The current-adding array includes a second voltage node U2, which is connectable with a ground or e.g., the negative (−)-output of the voltage-stabilized power supply. Switchable bridges are again provided in parallel between the first voltage node U1 and the second voltage node U2 and each bridge is each comprised of at least one transistor 25 or 26 and at least one resistor 27.

In the third preferred embodiment, all of the shown switchable bridges correspond to the right-side current array 24 of FIG. 4, i.e. the shown switchable bridges are preferably comprised of resistors 27 that have the same or substantially the same resistance value. A left-side current array 20 in accordance with FIG. 4 is also electrically coupled to each of the left-side and right-side current arrays 28, 29 of FIG. 5, in order to provide currents corresponding to the least significant bits of the multi-bit (e.g. 13-bit) data word that is utilized to control the respective current arrays 28, 29. The data word controlling the current array of FIG. 5 requires one additional bit for selecting which of the left-side or right-side current arrays 28, 29 is connected to the coil L, thereby determining the sign or polarity of the voltage applied to the coil L. As in the second preferred embodiment, the number of switchable bridges in the left-side and right-side current arrays 28, 29 is not limited, but in a particularly preferred embodiment, 128 switchable bridges having the same resistance values and 6 switchable bridges having different current values (not shown in FIG. 5) may be provided. More generally, the number of switchable bridges in the current-adding array of FIG. 5 may be between about 6 and 1056, more preferably between about 20 and 528, even more preferably between about 78 and 268.

In order to change the polarity across the coil L, in a first polarity mode, transistor A and one or more of transistors 26 of the right-side current array 29 are switched ON together and in a second polarity mode, transistor B and one or more of transistors 25 of the left-side current array 28 are switched ON together, thereby enabling an alternating current to be supplied to the coil L. Like the second preferred embodiment, although various types of transistors, e.g., power transistors may be utilized for transistors 25 and 26 and A and B, Field Programmable Gate Arrays (FGPA) are preferred. Again, transistors A and B should have relatively high current and voltage ratings, as some embodiments of the present teachings are intended to be capable of delivering several amps (e.g., 2-10 amps) and substantial voltages (e.g., 10-200 volts).

The third preferred embodiment has the advantage that two fewer high-power rated transistors A, B, which may be significantly more expensive than the lower power-rated transistors 25 and 26 that may be utilized for switching the individual currents, are required for connecting the current-adding array to the coil L. The third preferred embodiment also has the advantage that all transistors 25 and 26 of both the left-side and right-side current arrays 28, 29 may be n-channel FETs.

Each of the second and third preferred current arrays may be driven or controlled utilizing the control circuit shown in FIG. 2 and discussed further above with only minor modifications thereto, as will be apparent to the skilled person. Moreover, each of the second and third preferred current arrays is suitable for use in generating the magnetic fields 14, 15 for the image generating system shown in FIG. 3 and discussed further above.

As should be particularly apparent from the foregoing description, the present current-adding arrays are preferably capable of supplying relatively high-power currents for driving an inductance utilized in deflecting an electron beam for material processing applications such as cutting, welding, hardening, etc. The current-adding arrays of the present teachings are preferably constructed (i.e. the transistors and resistors of the respective switchable bridges are suitably selected) so as to have a rated output voltage of at least 10 volts, more preferably at least 20 volts, even more preferably at least 40 volts and in particularly high-voltage applications, more than 100 volts, more preferably more than 140 volts and even more preferably more than 200 volts.

In addition, or in the alternative, the current-adding arrays of the present teachings are preferably constructed (i.e. the transistors and resistors of the respective switchable bridges are suitably selected) so as to have a rated output current of at least 2 A, more preferably at least 4 A and even more preferably at least 8 A.

Thus, the present current-array systems may be designed, but certainly are not limited, to rated power outputs of more than 20 Watts, more preferably more than 100 Watts, even more preferably more than 200 Watts and in particularly high-power applications, more than 1000 or 1200 Watts. Herein, for each of the above-noted voltage, current and power values, the term "rated" is intended mean the maximum capacity of the current-adding array, such that any value between 0 and the rated capacity is supplyable to the inductive element.

REFERENCE NUMBER LIST

1 Control circuit
2 Amplifier
3 Data input
4 Gate
5 Adjusting Control Circuit
6 EEPROM—Code Converter
7 Analog-to-Digital Converter
8 Comparator
9 Auxiliary Amplifier
10 Low Pass Filter
20 Left-side current array
21 Transistor(s)
22 Resistor(s)
23 Resistor(s)
24 Right-side current array
25 Transistor(s)
26 Transistor(s)
27 Resistor(s)
28 Left-side current array
29 Right-side current array
A-D Transistors
L Inductive Element (e.g., coil)

The invention claimed is:

1. An amplifier for high-speed driving of an inductive element including a current-adding array comprising:
a first voltage node adapted to be coupled to a first polarity of a regulated power supply;
a second voltage node adapted to be coupled to the inductive element;
a third voltage node adapted to be coupled to a second polarity of the regulated power supply;
a first plurality (k) of switchable bridges switchably connectable in parallel between the first and second voltage nodes, each first switchable bridge being adapted to be switched separately and independently and including at least one resistor having a resistance value, wherein the respective resistance values of the plurality of first switchable bridges are defined such that a first resistor ($R1_1$) has a first resistance value $WR1_1$ equal to $R_{min}$, a second resistor ($R1_2$) has a second resistance value $WR1_2$ greater than or equal to $WR1_1$ and an n-th resistor has an n-th resistance value $WR1_n$ greater than or equal to $WR1_{n-1}$, wherein n=3, 4, . . . k;
a second plurality (k) of switchable bridges switchably connectable in parallel between the third voltage node and the second voltage node, each second switchable bridge being adapted to be switched separately and independently and including at least one resistor having a resistance value, wherein the respective resistance values of the plurality of second switchable bridges are defined such that a first resistor ($R2_1$) has a first resistance value $WR2_1$ equal to $R_{min}$, a second resistor ($R2_2$) has a second resistance value $WR2_2$ greater than or equal to $WR2_1$ and an n-th resistor has an n-th resistance value $WR2_n$ greater than or equal to $WR2_{n-1}$, wherein n=3, 4, . . . k;
wherein the power supply and the respective resistors are selected such that the amplifier has a rated current output of at least 2 amperes.

2. An amplifier according to claim 1, wherein the respective resistance values of the first plurality of switchable bridges are defined such that:
the second resistor ($R1_2$) has a second resistance value $WR1_2$ equal to $m_2 R_{min}$, wherein $2 \geq m_2 \geq 1$, and
the n-th resistor ($R1_n$) has an n-th resistance value $WR1_n$ equal to $m_n^{n-} R_{min}$, wherein $2 \geq m_n \geq 1$.

3. An amplifier according to claim 2, further comprising a control circuit having:
a data input arranged and constructed to receive a first data word having a first bit count,
a code converter selectively connectable with the data input and being arranged and constructed to convert, according to a predetermined conversion rule, an input data word having the first bit count into an output data word having a second bit count suitable for driving the first switchable bridges,
an A/D converter electrically connected with an output node of the current-adding array and being adapted to output a second data word having the first bit count,
a comparator circuit arranged and constructed to compare the first and second data words and to output a comparison result, and
an auxiliary amplifier having an output connected with the output node of the current-adding array and an input adapted to receive an input signal corresponding to the comparison result.

4. An amplifier according to claim 3, wherein m is greater than 1 for all resistors.

5. An amplifier according to claim 3, wherein m is greater than 1 for at least two resistors and m is 1 or approximately 1 for at least two other resistors.

6. An amplifier according to claim 1, wherein the respective resistance values of the first and second switchable bridges are defined such that:
each second resistor ($Ri_2$) has a second resistance value $WRi_2$ equal to $m_2 R_{min}$, wherein $2 \geq m_2 \geq 1$ and i=1, 2, and
each n-th resistor ($Ri_n$) has an n-th resistance value $WR1_n$ equal to $m_n^{n-1} R_{min}$, wherein $2 \geq m_n \geq 1$.

7. An amplifier according to claim 6, wherein at least one of the following conditions selected from the group consisting of:

$m_n \geq m_{n-1}$, and
$m_n = m_{n+1}$ for $n \geq 3, 4, 5, 6, \ldots$ is satisfied.

8. An amplifier according to claim 1, further comprising a control circuit having:
   a data input arranged and constructed to receive a first data word having a first bit count,
   a code converter selectively connectable with the data input and being arranged and constructed to convert, according to a predetermined conversion rule, an input data word having the first bit count into an output data word having a second bit count suitable for driving the first switchable bridges,
   an A/D converter electrically connected with an output node of the current-adding array and being adapted to output a second data word having the first bit count,
   a comparator circuit arranged and constructed to compare the first and second data words and to output a comparison result, and
   an auxiliary amplifier having an output connected with the output node of the current-adding array and an input adapted to receive an input signal corresponding to the comparison result.

9. An electron gun system comprising:
   a first deflection coil arranged and constructed to deflect an electron beam in a first direction,
   a first amplifier according to claim 1, wherein an output node of the current-adding array of the first amplifier is connected to the first deflection coil,
   a second deflection coil arranged and constructed to deflect the electron beam in a second direction,
   a second amplifier according to claim 1, wherein an output node of the current-adding array of the second amplifier is connected to the second deflection coil, and
   a control circuit arranged and constructed to separately and independently drive the first and second switchable bridges of each of the first and second amplifiers, respectively.

10. An electron gun according to claim 9, wherein the control circuit includes:
    a data input arranged and constructed to receive a first data word having a first bit count,
    a code converter selectively connectable with the data input and being arranged and constructed to convert, according to a predetermined conversion rule, an input data word having the first bit count into an output data word having a second bit count suitable for driving the respective first switchable bridges,
    an A/D converter electrically connected with the respective output nodes of the current-adding arrays and being adapted to output a second data word having the first bit count,
    a comparator circuit arranged and constructed to compare the first and second data words and to output a comparison result, and
    at least one auxiliary amplifier having an output connected with the respective output nodes of the current-adding arrays and an input adapted to receive an input signal corresponding to the comparison result.

11. An amplifier for high-speed driving of an inductive element including a current-adding array comprising:
    a first voltage node and a second voltage node, at least one of the first and second voltage nodes adapted to being coupled to a regulated power supply;
    a first plurality (k) of switchable bridges switchably connectable in parallel between the first and second voltage nodes, each switchable bridge of the first plurality of switchable bridges being arranged and constructed to generate a different current value and including at least one resistor having a resistance value, wherein the respective resistance values of the plurality of first switchable bridges are defined such that a first resistor ($R1_1$) has a first resistance value $WR1_1$ equal to $R_{min}$, a second resistor ($R1_2$) has a second resistance value $WR1_2$ greater than or equal to $WR1_1$ and an n-th resistor has an n-th resistance value $WR1_n$ greater than or equal to $WR1_{n-1}$, wherein $n=3, 4, \ldots k$; and
    a second plurality of switchable bridges switchably connectable in parallel between the first voltage node and the second voltage node, each switchable bridge of the second plurality of switchable bridges being arranged and constructed to generate substantially the same current value and including at least one resistor having a resistance value, wherein the power supply and the respective resistors are selected such that the amplifier has a rated current output of at least 2 amperes.

12. An amplifier according to claim 11, wherein the first plurality of switchable bridges consists of between 4 and 16 switchable bridges and the second plurality of switchable bridges consists of between 16 and 256 switchable bridges.

13. An amplifier according to claim 12, wherein the power supply and the respective resistors are selected such that the amplifier has a rated current output of at least 8 amperes.

14. An amplifier according to claim 13, further comprising:
    a control circuit arranged and constructed to separately and independently drive the first and second switchable bridges, each switchable bridge comprising at least one transistor that is series-connected with the at least one resistor and that is controllable by the control circuit.

15. An amplifier according to claim 14, wherein the control circuit includes:
    a data input arranged and constructed to receive a first data word having a first bit count,
    a code converter selectively connectable with the data input and being arranged and constructed to convert, according to a predetermined conversion rule, an input data word having the first bit count into an output data word having a second bit count adapted for driving the switchable bridges,
    an A/D converter electrically connected with an output node of the current-adding array and being adapted to output a second data word having the first bit count,
    a comparator circuit arranged and constructed to compare the first and second data words and to output a comparison result, and
    an auxiliary amplifier having an output connected with the output node of the current-adding array and an input adapted to receive an input signal corresponding to the comparison result.

16. An amplifier according to claim 15, further comprising:
    an adjusting control circuit arranged and constructed to receive the comparison result from the comparator circuit and to influence the output of the code converter so that the first data word and the second data word are harmonized.

17. An amplifier according to claim 16, wherein the control circuit is arranged and constructed to over-drive the current-adding array, which over-driving operation is adapted, in duration and amplitude, to an amount of a change of the current that is to-be-output at the first output.

18. An amplifier according to claim 17, further comprising:
a circuit for short-circuiting the inductive element close to the low end of the inductive element, which low end is connectable to the output node of the current-adding array, during a switching operation of the first and second switchable bridges.

19. An electron gun system comprising:
a first deflection coil arranged and constructed to deflect an electron beam in a first direction,
a first amplifier according to claim 13 having an output node electrically connected to the first deflection coil,
a second deflection coil arranged and constructed to deflect the electron beam in a second direction,
a second amplifier according to claim 13 having an output node electrically connected to the second deflection coil, and
a control circuit arranged and constructed to separately and independently drive the first and second switchable bridges of each of the first and second amplifiers, respectively.

20. An electron gun according to claim 19, wherein the control circuit includes:
a data input arranged and constructed to receive a first data word having a first bit count,
a code converter selectively connectable with the data input and being arranged and constructed to convert, according to a predetermined conversion rule, an input data word having the first bit count into an output data word having a second bit count suitable for driving the respective first and second switchable bridges,
an A/D converter electrically connected with the respective output nodes of the current-adding arrays and being adapted to output a second data word having the first bit count,
a comparator circuit arranged and constructed to compare the first and second data words and to output a comparison result, and
at least one auxiliary amplifier having an output connected with the respective output nodes of the current-adding arrays and an input adapted to receive an input signal corresponding to the comparison result.

21. An electron gun system according to claim 20, further comprising
an electron beam gun arranged and constructed to generate the electron beam, and
a memory storing a digital processing- and scanning-pattern, which pattern defines a path of the electron beam in a processing- and scanning-area on a work piece to be processed using the electron beam gun,
wherein the control circuit is arranged and constructed to drive the first and second deflection coils so as to deflect the electron beam according to the processing- and scanning-pattern.

22. An electron gun system according to claim 21, further comprising:
at least two sensors arranged and constructed to independently detect electrons that are back-scattered from the work piece during the processing with the electron beam, and to output an output signal representative of the intensity of the detected back-scattered electrons, and
an evaluation circuit arranged and constructed to generate a differential signal from the output signals of the at least two sensors and to generate an image signal from the differential signal, the image signal containing information that depicts the processing- and scanning-area such that the differential signal can be displayed in a first color and the inverse differential signal can be simultaneously displayed in a second color.

23. An electron gun system according to claim 22, wherein the evaluation circuit includes:
a first pre-amplifier having an input connected with one of the at least two sensors,
a second pre-amplifier having an input connected with the another of the at least two sensors,
a differential amplifier having inputs respectively connected with the outputs of the first and second pre-amplifiers, and
a power amplifier having two push-pull outputs and an input connected with the output of the differential amplifier.

24. An electron gun system according to claim 23, further comprising:
a color display electrically connected to the push-pull outputs of the power amplifier and being adapted to simultaneously display the differential signal and the inverse differential signal in different colors.

\* \* \* \* \*